United States Patent [19]

Schiess et al.

[11] Patent Number: 5,265,168
[45] Date of Patent: Nov. 23, 1993

[54] HEARING AID

[75] Inventors: Hans-Rudolf Schiess, Zufikon; Benno Moser, Unteraegeri, both of Switzerland

[73] Assignee: Siemens Aktiengesellschaft, Munich

[21] Appl. No.: 808,534

[22] Filed: Dec. 13, 1991

[30] Foreign Application Priority Data

Dec. 18, 1990 [EP] European Pat. Off. ........ 90124629.8

[51] Int. Cl.$^5$ ............................................. H04R 25/00
[52] U.S. Cl. ...................... 381/69; 381/68.7; 381/69.2
[58] Field of Search ............... 381/69, 69.2, 68, 68.6, 381/68.7, 69.1; 361/413; 439/66, 91

[56] References Cited

U.S. PATENT DOCUMENTS

| 3,015,704 | 1/1962 | Behymer | 381/68.4 |
| 4,194,800 | 3/1980 | Chow | 339/17 |
| 4,199,637 | 4/1980 | Sado | 428/119 |
| 4,221,444 | 9/1980 | Patrick | 339/17 |
| 4,354,065 | 10/1982 | Buettner | 381/68.7 |
| 4,628,527 | 12/1986 | Henneberger et al. | 381/69.2 |
| 4,628,527 | 12/1986 | Henneberger et al. | 381/68.2 |
| 4,922,540 | 5/1990 | Erbe | 381/69 |
| 4,958,050 | 9/1990 | Oku et al. | 439/91 |

FOREIGN PATENT DOCUMENTS

| 0238887 | 9/1987 | European Pat. Off. | 381/68.7 |
| 2652683B2 | 5/1981 | Fed. Rep. of Germany. | |
| 3224668A1 | 12/1983 | Fed. Rep. of Germany. | |
| 3245030A1 | 6/1984 | Fed. Rep. of Germany. | |
| 3623906A1 | 1/1988 | Fed. Rep. of Germany. | |
| 8630860.2 | 7/1988 | Fed. Rep. of Germany. | |
| 0049425 | 11/1981 | Japan | 439/91 |

Primary Examiner—Jin F. Ng
Assistant Examiner—Huyen D. Le
Attorney, Agent, or Firm—Hill, Steadman & Simpson

[57] ABSTRACT

For a simplified design of electrical line connections in a hearing aid, and in order to avoid solder locations, an anisotropic, electrically conductive, plate-shaped, film-shaped or mat-shaped member is arranged between interconnects of a printed circuit board. Contacts of the hearing aid components are secured to the printed circuit board.

10 Claims, 4 Drawing Sheets

HEARING AID

BACKGROUND OF THE INVENTION

The invention is directed to a hearing aid having, for example, a microphone, an amplifier means, an earphone, and a current source, as well as additional components such as an actuator, a switch, and a control element that are connected to a printed circuit board in the inside of a hearing aid housing.

In known hearing aids, the electrical contacts of the hearing aid component parts are connected by electrical leads to the spring contacts of the current source and terminals of a printed circuit board that forms an electrical circuit. Operating elements such as actuators (trimmers), potentiometers, switches, etc. can thus be soldered either directly onto the printed circuit board or can be soldered with the interconnects thereof which are stranded flexible conductors. In order to achieve a space-saving structure of the amplifier means, DE-A-32 45 030, corresponding to U.S. Pat. No. 4,628,527, incorporated herein, discloses that openings for component parts to be directly attached to the amplifier motherboard (printed circuit board) can be provided in the carrier plate of the motherboard or printed circuit board, the component parts being introducible into these openings. Thus, the component parts have their electrical terminal wires or solder legs soldered to the interconnects of the carrier plate, whereas the component parts themselves should be clampable into the openings of the carrier plate.

The known solutions are involved with respect to the contacting of the component parts, whereby it is particularly the production of the soldered connections that is viewed as being disadvantageous.

SUMMARY OF THE INVENTION

It is an object of the invention to create a hearing aid of the type initially cited having assembly-friendly connections between the components (actuators/trimmers, switches, potentiometers, current source and electronics or printed circuit board), whereby soldered connections are avoidable and the components are secured in a way to be easily replaced. The circuit structure of the electronic components should be simplified by the invention.

According to the hearing aid of the invention, a hearing aid housing is provided. Within the hearing aid housing, a microphone, amplifier means, earphone, current source, as well as additional components connected to at least one printed circuit including an actuator, a switch, and a control element are provided. An anisotropic electrically conductive layer-shaped member formed of an electrically insulating matrix material having a plurality of electrically conductive fibers which are aligned perpendicularly to a plane of the layer and uniformly distributed therein is provided. This layer-shaped member is arranged between interconnects of the printed circuit board and contacts of components securable to the printed circuit board. The actuator, controller element, and switch are arranged at the printed circuit board.

A solder-free mounting of the operating elements and/or of the electrical components, or of electrical component groups is possible in the hearing aid of the invention. The electrical connection of the operating elements or components to a printed circuit board occurs on the basis of an anisotropic, electrically conductive member that is arranged between the electrical terminals of the operating elements or components and the tape of the interconnects or the interconnects themselves of a printed circuit board, or of a carrier of the interconnects in the hearing aid. An anisotropic, electrically conductive plate-shaped or film-shaped member as well as a method for the manufacture thereof are disclosed by DE-B-26 52 683, corresponding to U.S. Pat. No. 4,199,637, incorporated herein. When a contacting pressure is produced between the components, the anisotropic member, and the interconnects or interconnect terminals (for example, by a retaining mechanism or by a screw-type connection), then a conductive connection from the interconnects via the aligned, electrically conductive fibers of the anisotropic member to the electrical terminals of the components or operating elements results. The fibers embedded into the matrix material in the direction of the contacting pressure permit an electrically conductive connection and pressure-sensitive, electrical contact points to be formed in the direction perpendicular to the plane of, for example, the plate-shaped member. No conductive directions result in the directions lying in the plane of the plate-shaped member. The matrix material forms an adequately high, insulating resistance in these planes, so that a great number of electrical terminals is possible on a small area.

A simple, time-saving assembly of the operating elements and components of the hearing aid is possible according to the invention without soldering processes. In case of service, further elements can be replaced in a simple and time-saving way. Since the high soldering temperatures are eliminated, the risk of damage due to temperature influences is eliminated and the demands made of the temperature resistance of the component parts are lower. The mounting or assembly of the component parts or operating elements can be automated and, as a result thereof, the assembly times can be shortened and assembly errors can be suppressed. Finally, the design of the component parts and the structuring of the hearing aid can be significantly simplified in that solder legs at the component parts as well as stranded conductors and wire connections in the hearing aid are at least largely eliminated.

DESCRIPTION OF THE PREFERRED EMBODIMENTS

Figure 1:
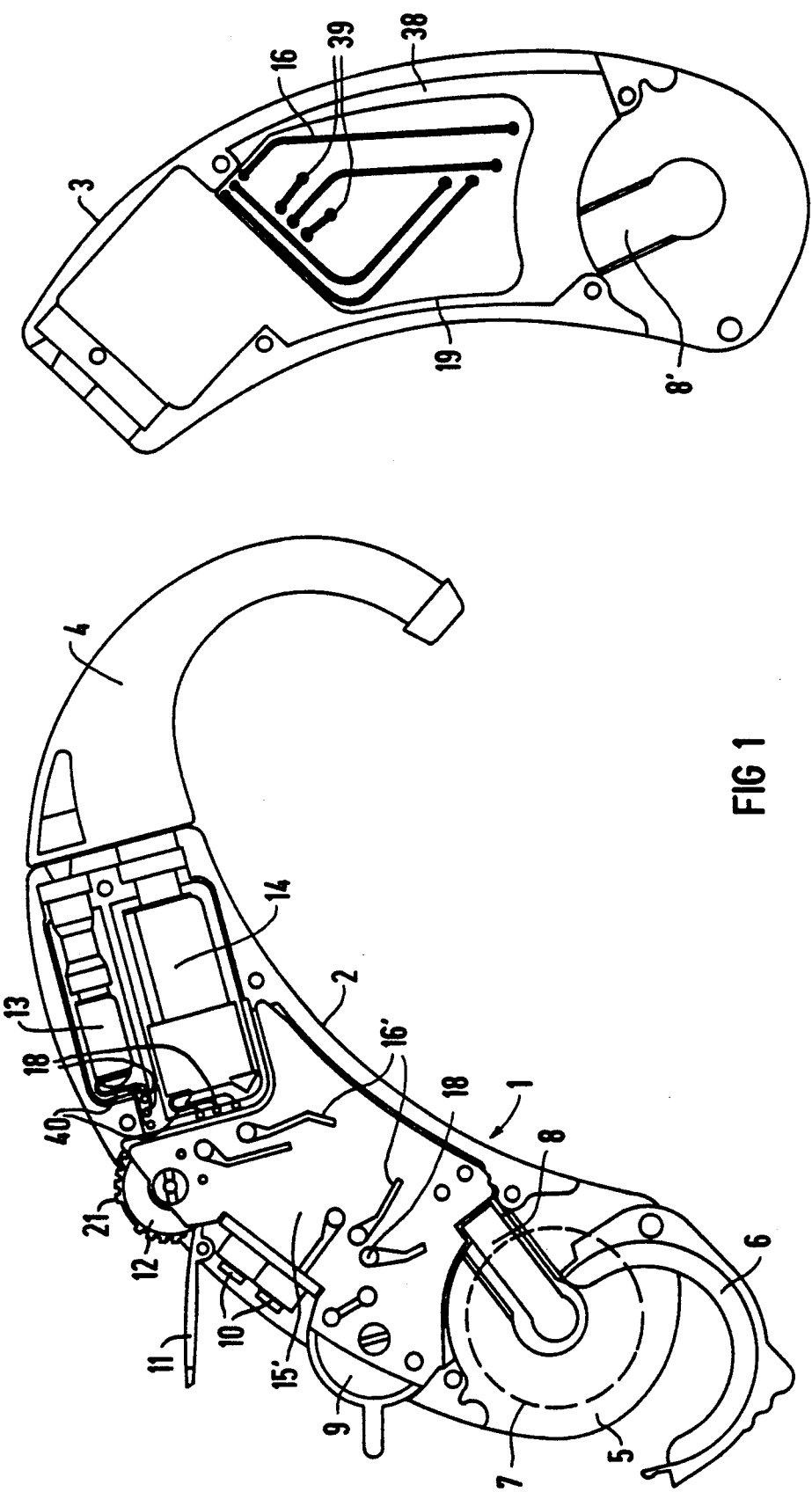
FIG. 1 is a hearing aid 1 designed in conformity with the invention and which is designed as a behind-the-ear hearing aid in the exemplary embodiment; and wherein the inside wall of the housing part 3 provided with interconnects 16 on a wall section 38 forms a printed circuit board part, instead of a separate printed circuit board.

In FIG. 1, 1 references a hearing aid to be worn behind the ear (BTE hearing aid) whose hearing aid housing, for example, is composed of a shell-shaped lower housing part 2 and of a shell-shaped cover 3. For being worn at the ear, the housing comprises a carrying hook 4 at one end. For the acceptance of a power source, for example a battery 7, a battery compartment 5 having a pivotable battery drawer 6 allocated thereto is provided in the housing. Furthermore, battery spring contacts 8, 8' are present for tapping the battery poles, these battery spring contacts 8, 8' being connected to the electrical circuit of the hearing aid. A MTO switch 9 is provided in the exemplary embodiment for switching the hearing aid on (microphone mode), for switching to a telephone mode, and for switching the hearing aid off (0 position). For varying or setting the characteristics of an amplifier unit, the hearing aid 1 comprises actuators/trimmers 10 that are accessible via an actuator flap 11 of the housing. The actuation element 21 of a volume control designed as a potentiometer 12 projects from the housing. Finally, a microphone 13 and an earphone 14 are arranged in the hearing aid housing.

In the embodiment of FIG. 1 (wherein the cover 3 is shown removed from the lower housing part 2), the component parts of the hearing aid are predominantly arranged in the lower part 2. An amplifier motherboard 15' which carries electrical components and operating parts 8, 9, 10, 12 comprises interconnects 16' to which contacts or contact points 18 are allocated. Sound transducers 13, 14 are connected to the electronics of the amplifier motherboard 15' via their pigtails 40.

Replacing a separate printed circuit board, a wall section 38 of the inside of the cover forms the insulated carrier for conductors 16 attached in insulated fashion from one another. These conductors 16 have contact points 39 allocated to them. 8' indicates a battery spring contact. The cover 3 is placed onto the housing part 2 equipped with the component parts upon interposition of a film-shaped or mat-shaped, anisotropic, electrically conductive member 19. The required contact pressure that produces or closes the desired circuit between the electrical component parts of the housing parts arises when the two housing parts 2, 3 are secured. As FIG. 1 shows, the assemblies to be electrically connected are constructed with contact points. The required conductors are situated in the housing cover 3. These can be produced in the housing cover by structuring conductors directly in the plastic or by inserting flexible conductors. By introducing one or more members 19 before the housing is closed, when the housing parts are screwed together the conductors 16 are connected to the contact points 18 of the assemblies 8 through 10, and 12 through 14, and the contact points 18 of the amplifier motherboard 15'.

This hearing aid structure of the invention combines the following advantages: time-saving final assembly of the hearing aids without soldered connections; time-saving possibility of replacing the hearing aid assemblies without undoing and renewing soldered connections; avoiding stranded-conductor connections in the final assembly which are difficult to manipulate; and simple and largely automatable final assembly.

Figure 9:
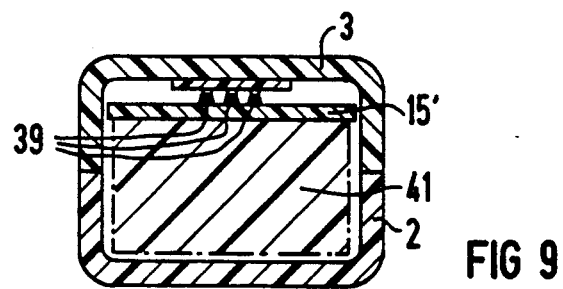
FIG. 9 is a cross section through the hearing aid of FIG. 1, given a closed hearing aid housing.
Figure 10:
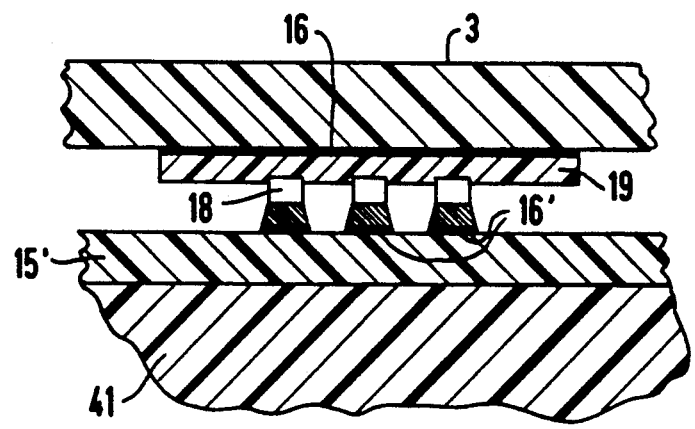
FIG. 10 is an enlarged detail of the conductive connection between interconnects 16 applied to the inside of the hearing aid housing part 3, a film-shaped or mat-shaped anisotropic member 19 and contact points 18 of either electrical component parts that are accommodated in the other hearing aid housing part 2 and/or of an amplifier motherboard 15' that is likewise arranged in the housing part 2 and again carries electrical components such as switches 9, actuators 10, potentiometers 12, filter chips or other electronic components, and a battery spring contact 8 also attached to the amplifier motherboard 15', in the exemplary embodiment.

FIGS. 9 and 10 show details of the housing structure of the hearing aid of the invention. 41 references an assembly of the amplifier unit.

Figure 2:
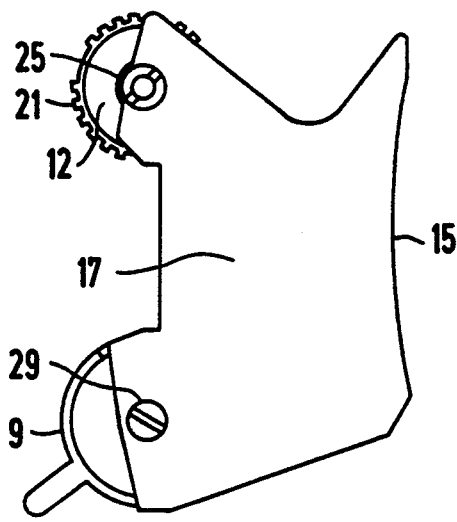
FIG. 2 is a view onto the carrier plate 17 of a printed circuit board 15 of a hearing aid of the invention to which a switch 9, for example a M-T-O switch, and a potentiometer 12, or a volume control or an actuator element/trimmer are secured.
Figure 3:
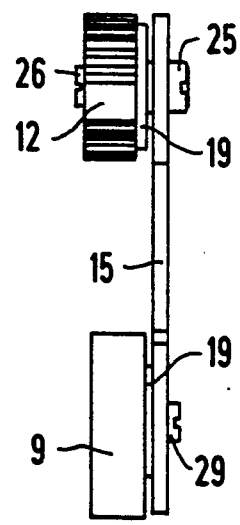
FIG. 3 illustrates an end view relating to FIG. 2 from which it proceeds that the switch 9 and the actuator element or potentiometer 12 are held against the printed circuit board side carrying the interconnects, and upon interposition of an anisotropic member 19.
Figure 4:
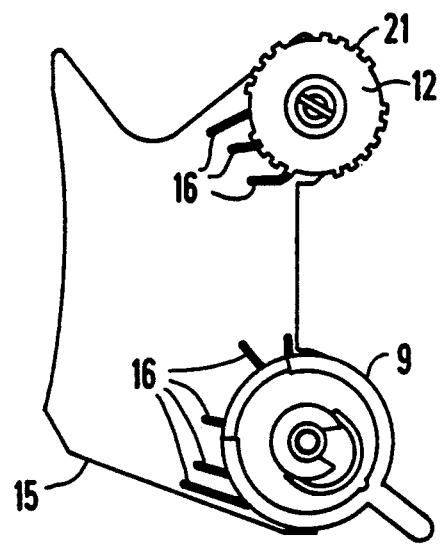
FIG. 4 shows a plan view onto the side of the printed circuit board 15 of FIGS. 2 and 3 which carries the interconnects 16.

In the embodiment of FIGS. 2 through 4, a printed circuit board 15 supported by an insulator carrier plate 17 serves as a mount for a switch 9 and for an actuator, for example a volume control 12. Upon interposition of anisotropic members 19, the switch 9 and volume control/potentiometer 12 are thereby supported against that side of the printed circuit board comprising the interconnects 16 such that electrically conductive connections exist between interconnects of the printed circuit board and electrical contacts of the switch, or of the potentiometer.

Figure 5:
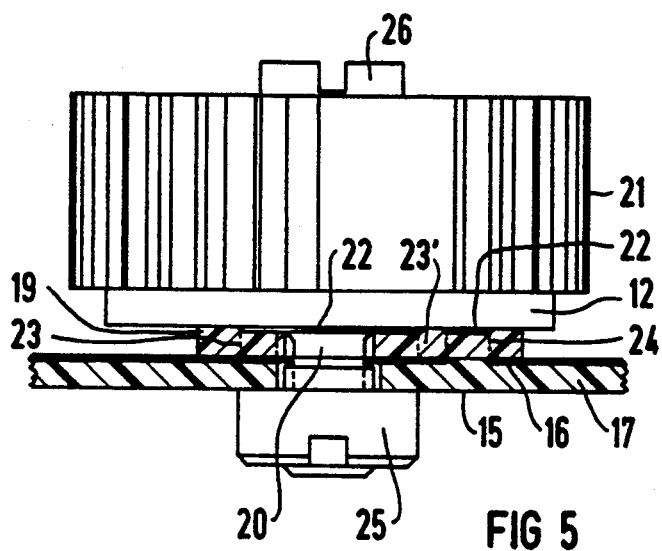
FIG. 5 shown in an enlarged scale and partially in section, illustrates the inventive arrangement of an actuator or potentiometer 12 of the hearing aid 1 at a printed circuit board

Taking the embodiment of FIG. 5 into consideration, it derives for the potentiometer arrangement that an anisotropic, electrically conductive member 19 presses onto a printed circuit board 15 covering a plurality of interconnects 16. A peg 20, a shaft, or the like which carries an actuation element 21 of the potentiometer 12 is conducted through the anisotropic member and through the printed circuit board. Wiper contacts 22 or the like are provided at the underside of the potentiometer which presses against the anisotropic member. The peg for holding the potentiometer is positioned against the carrier plate and—for the contact pressure of the wiper contacts—against the anisotropic member as well as against the interconnects. In the exemplary embodiment, the potentiometer holder is formed of a threaded nut 25 that is supported against the carrier plate 17 and into which the peg 20 of the potentiometer 12 can be screwed. 26 references a detent or a checknut or the like for holding the actuation element 21 of the potentiometer. 23, 23' and 24 reference the contact regions deriving in the potentiometer of FIG. 5 between the contact points 22 of the potentiometer 12 and the interconnects 16—bridged by the member 19.

Figure 6:
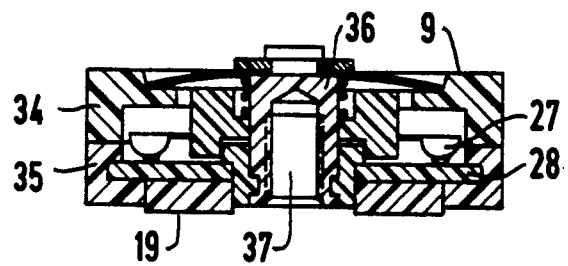
FIG. 6 is an enlarged scale and sectional view of a switch structure of the hearing aid.
Figure 8:
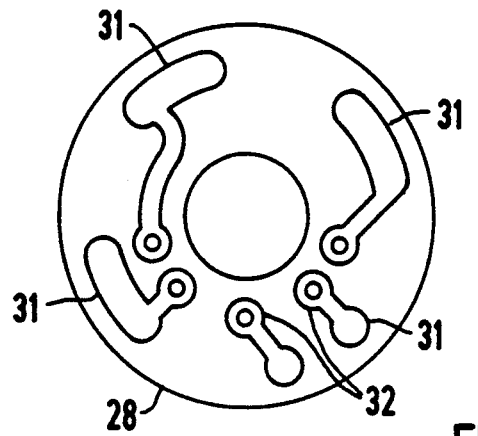
FIG. 8 is a contact plate 28 of the switch 9 according to FIGS. 6 and 7.
Figure 7:
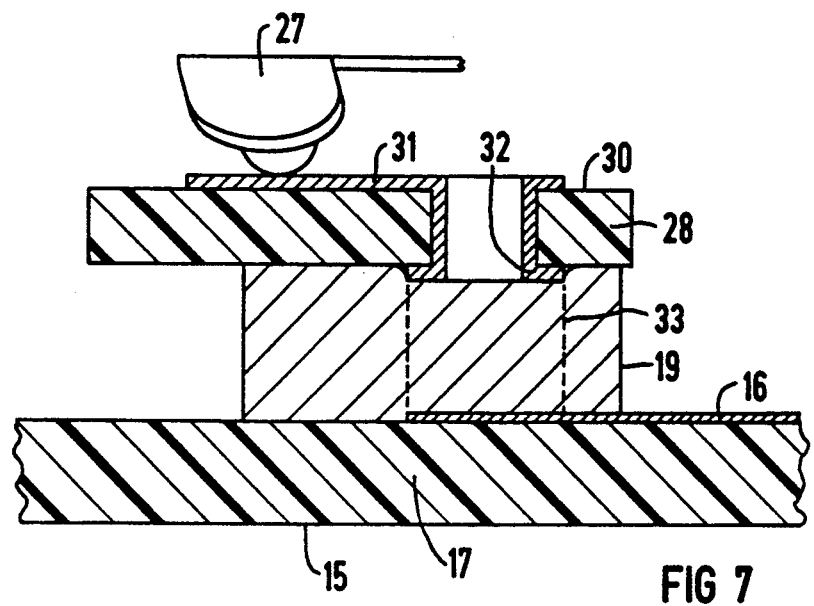
FIG. 7 shows in enlarged detail, the switch 9 of FIG. 6.

FIGS. 6 through 8 show an advantageous switch arrangement of the hearing aid of the invention. An anisotropic, electrically conductive member 19 thereby lies against that side of the printed circuit board 15 carrying the interconnects 16, and a switch 9 is provided that comprises at least one movable switch contact 27 designed as a wiper and a contact plate 28 that is supported against the anisotropic member. The switch can be secured to the carrier plate 17 of the printed circuit board with a fastening means, for example a screw 29 or the like, that effects the holding of the switch and the contacting.

It is provided in another development that the switch 19 comprises a bipartite housing 34, 35; that the contact plate 28 and the anisotropic member 19, which has a seating surface projecting from the lower housing part at the floor side toward the interconnects of the printed circuit board, are introduced into the lower housing part 35. A holding mechanism 36 for the switch contact or contacts 27 as well as a receptacle 37 for a fastening element, for example a screw 29, are provided in the upper housing part 34. The fastening element 29 can be introduced into the receptacle 27 of the switch holding mechanism through a bore of the printed circuit board such that the switch can be secured to the carrier plate 17 of the printed circuit board 15 with contacting pressure between the contacts 32 of the contact plate 28, the anisotropic member 19, and the interconnects 16.

In a further development, the contact plate 28 is formed of electrically insulating material. At its upper side 30 allocated to the switch contact 27 or to the switch contacts, the contact plate 28 carries electrically conductive wiper taps 31. Contacts 32 are conducted from the wiper taps 31 through the contact plate, whereby these contacts 32 press against the anisotropic member 19 in an electrically conductive connection therewith. As recited in FIG. 7, there is a conductive connection to the interconnect 16 at a contact region 33 of the member 19 via the metallic wiper tap 31 and via the through-contacting 32 in the illustrated switch position.

Although various minor changes and modifications might be proposed by those skilled in the art, it will be understood that we wish to include within the claims of the patent warranted hereon all such changes and modifications as reasonably come within our contribution to the art.

We claim as our invention:

1. A hearing aid, comprising:
   a hearing aid housing formed of a first part and a second part;
   the first housing part having a printed circuit board with hearing aid components connected thereto and contact points;
   the second housing part having arranged therein interconnects with contact points; and
   an anisotropic electrically conductive layer-shaped member formed of an electrically insulating matrix material having a plurality of electrically conductive fibers which are aligned perpendicularly to a plane of the layer and uniformly distributed therein, said layer-shaped member being positioned between the two housing parts such that when the two housing parts are assembled together the layer-shaped member provides electrical connections between the contact points of the first housing part printed circuit board and the contact points of the second housing part interconnects.

2. A hearing aid according to claim 1 further including:
   an additional anisotropic electrically conductive layer shaped member also formed of an electrically insulating matrix material having a plurality of electrically conductive fibers which are aligned perpendicularly to a plane of the layer and uniformly distributed therein;
   additional interconnects on said printed circuit board in said first housing having contact points;
   at least one hearing aid component having contact points and which is positioned over said contact points of said additional interconnects; and
   said additional layer-shaped member being positioned between said contact points on said at least one hearing aid component and said contact points on said additional interconnects so as to connect said contact points on the at least one component to respective ones of said contact points on the additional interconnects.

3. A hearing aid according to claim 2 wherein the at least one hearing aid component comprises a volume control.

4. A hearing aid according to claim 2 wherein said at least one hearing aid component comprises a switch.

5. A hearing aid, comprising:
   a hearing aid housing having a printed circuit board therein having hearing aid components connected thereto and at least one hearing aid component mounted adjacent the printed circuit board;
   said printed circuit board having electrical contact points thereon connecting to interconnects;
   said at least one hearing aid component having contact points; and
   an anisotropic electrically conductive layer-shaped member formed of an electrically insulating matrix material having a plurality of electrically conductive fibers which are aligned perpendicularly to a plane of the layer and uniformly distributed therein, said layer shaped member being positioned between said at least one hearing aid component and said printed circuit board so as to provide electrical connections between said contact points on the at least one hearing aid component and respective ones of said contact points of the interconnects on the printed circuit board.

6. A hearing aid according to claim 5 wherein the at least one hearing aid component comprises a switch.

7. A hearing aid according to claim 5 wherein the at least one hearing aid component comprises a volume control.

8. A hearing aid, comprising:
   a hearing aid housing containing a circuit board having hearing aid components connected thereto;
   an anisotropic electrically conductive layer shaped member formed of an electrically insulating matrix material having a plurality of electrically conductive fibers which are aligned perpendicularly to a plane of the layer and uniformly distributed therein;
   a first set of contact points on the printed circuit board and a second set of contact points connected to hearing aid circuitry to be connected to the first set of contact points; and
   said layer shaped member being positioned between the first set of contact points and the second set of contact points to provide electrical connections between the first and second sets of contact points.

9. A hearing aid according to claim 8 wherein the second set of contact points are positioned on interconnects positioned adjacent a wall of the housing opposite the printed circuit board.

10. A hearing aid according to claim 8 wherein the second set of contact points are on a hearing aid component mounted above at least some of said first set of contact points on the printed circuit board.

* * * * *